(12) United States Patent
Matsumura et al.

(10) Patent No.: US 7,777,898 B2
(45) Date of Patent: Aug. 17, 2010

(54) WORKPIECE MACHINING APPARATUS

(75) Inventors: Kaoru Matsumura, Ebina (JP);
Fumiaki Kimura, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 134 days.

(21) Appl. No.: 12/071,356

(22) Filed: Feb. 20, 2008

(65) Prior Publication Data
US 2008/0239326 A1  Oct. 2, 2008

(30) Foreign Application Priority Data
Mar. 30, 2007  (JP) ............................. 2007-095001

(51) Int. Cl.
*G01B 11/14* (2006.01)
(52) U.S. Cl. ..................................... 356/614
(58) Field of Classification Search .............. None
See application file for complete search history.

(56) References Cited
U.S. PATENT DOCUMENTS

| | | | | |
|---|---|---|---|---|
| 4,560,273 A | * | 12/1985 | Ando et al. | 356/237.6 |
| 5,661,548 A | * | 8/1997 | Imai | 355/55 |
| 6,683,684 B1 | * | 1/2004 | Boureau et al. | 356/237.6 |
| 7,241,664 B2 | * | 7/2007 | Kobayashi | 438/401 |
| 7,462,801 B1 | | 12/2008 | Hiramatsu | |
| 2005/0071990 A1 | * | 4/2005 | Nakamura et al. | 29/740 |

* cited by examiner

*Primary Examiner*—Gregory J Toatley, Jr.
*Assistant Examiner*—Juan D Valentin
(74) *Attorney, Agent, or Firm*—Wenderoth, Lind & Ponac, L.L.P.

(57) ABSTRACT

A laser machining apparatus is capable of improving workpiece machining precision. The laser machining apparatus has a movable table for supporting a workpiece to be machined, and a camera for detecting the position of the workpiece by reflection light from an alignment mark formed through the workpiece. The apparatus also includes a jig plate provided between the table and the workpiece, and has light-receiving holes that overlap with the alignment mark (through-hole) and that are larger than the alignment mark (through hole).

7 Claims, 5 Drawing Sheets

WORKPIECE MACHINING APPARATUS

BACKGROUND OF THE INVENTION

1. Field of the Invention

The present invention relates to a workpiece machining apparatus for machining workpieces by detecting the position thereof by reflection light from position-detecting through holes formed through the workpiece.

2. Description of Related Art

Hitherto, positioning of a printed circuit board, i.e., a workpiece to be machined by a workpiece machining apparatus, on a table has been carried out based on an alignment mark provided on a surface or in an inner layer of the printed circuit board. Then, there has been a method of irradiating light from the under (bottom) side of the printed circuit board to detect the alignment mark of the printed circuit board whose insulating layer is transparent or semitransparent in silhouette as disclosed in Japanese Patent No. 3023320.

Lately, it has become possible to machine a blind hole for connecting an upper layer with an inner layer by laser even in a printed circuit board whose surface layer (uppermost layer) is a copper layer. In this case, a surface treatment of forming a black CuO layer for example is often implemented on the surface of the uppermost copper layer to prevent the laser from being reflected by the copper layer. Then, a through hole is adopted as an alignment mark because the copper layer does not transmit light and it is hard to dispose an alignment mark on the surface by printing or the like.

FIG. 6 shows a prior art method for detecting the alignment mark by scanning an image thereof and FIG. 7 shows a printed circuit board P seen from a direction of an arrow K in FIG. 6.

An uppermost layer of the printed circuit board P is a copper layer and a black CuO layer whose thickness is about 2 µm is formed on the surface thereof. A thickness of the printed circuit board P is 1 mm to 3 mm. A plurality of through holes 18 (referred to as "alignment marks" hereinafter) is formed through the printed circuit board P. A diameter d1 of the alignment mark 18 is 1 mm to 3 mm. A ringed (annular) light 22 is disposed at an outer periphery of a camera 20. The camera 20 is connected with an image processing device not shown.

When the alignment mark 18 is illuminated aslant, a profile of the alignment mark 18 becomes ambiguous because a shadow S is made due to the illumination within the alignment mark 18. Because the image processing device calculates center coordinates of the alignment mark 18 by detecting the profile of the alignment mark 18, its precision for detecting the center coordinates drops when the profile detecting precision drops. Then, machining precision of the workpiece machining apparatus has dropped as a result. The profile detecting precision drops when a scratch is made around the alignment mark 18 in particular.

It may be possible to solve the abovementioned problem by adopting the technique of Japanese Patent No. 3023320. However, a degree of freedom of disposition of the alignment marks decreases when a number of illuminators is reduced. When the number of illuminators is increased to increase the degree of freedom of disposition of the alignment marks, there arise problems in that not only does the structure of the apparatus become expensive, but also a space for disposing vacuum chucking holes becomes narrow. It thus limits a number of holes for chucking the printed circuit board P and lowers a workpiece holding performance.

Accordingly, an object of the invention is to provide a workpiece machining apparatus whose workpiece machining precision is improved.

SUMMARY OF THE INVENTION

According to the invention, a workpiece machining apparatus (100) has a movable table (9) for supporting a workpiece (P) to be machined and a position detecting device (20) for detecting a position of the workpiece (P) by reflection light from a position-detecting through hole (18) formed through the workpiece (P). The apparatus further includes a plate-like intermediate member (10) provided between the table (9) and the workpiece (P) and having light-receiving openings (12) that overlap with the position-detecting through holes (18) and whose opening area is wider than that of the position-detecting through hole (18).

Light entering to the position-detecting through hole (18) reflects on the table (9) by passing through the light-receiving opening (12) and illuminates the position-detecting through hole (18) from the side of the table (9). Therefore, the whole position-detecting through hole (18) is illuminated and no shadow of the through hole (18) is generated. The position detecting device (20) detects the position-detecting through hole (18) which causes no shadow and whose profile is not ambiguous, it can detect center coordinates of the through hole (18) accurately.

It is noted that the reference numerals within the parentheses above are denoted for the purpose of collating with parts in the drawings and do not limit the structure of the invention by any means.

Accordingly, the workpiece machining apparatus of the invention can improve its workpiece machining precision by steadily detecting the position of the workpiece because it is capable of accurately detecting the center coordinates of the position-detecting through hole.

DETAILED DESCRIPTION OF THE INVENTION

A preferred embodiment of the invention will be explained below.

Figure 1:
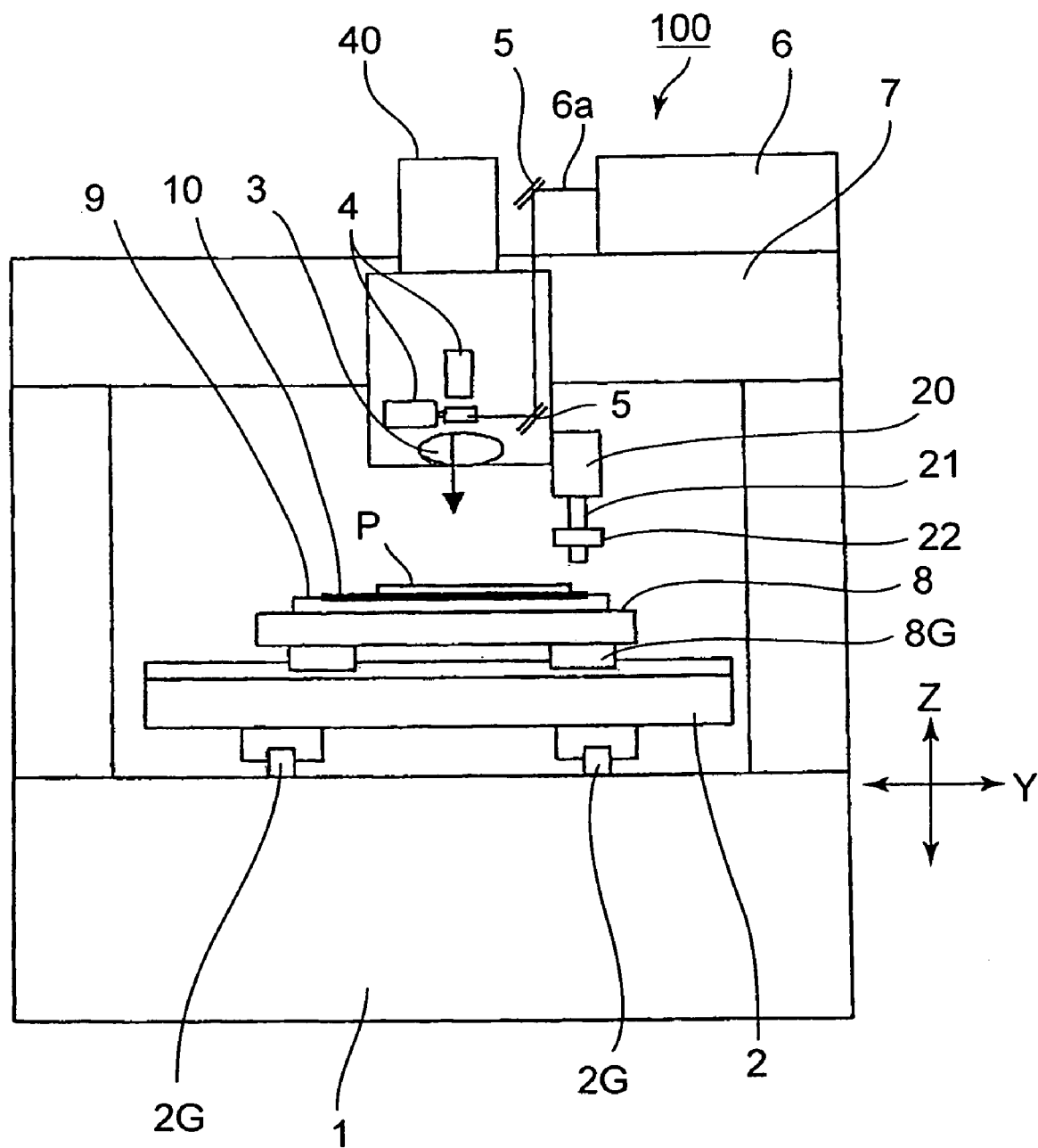
FIG. 1 is a front view of a laser machining apparatus as a workpiece machining apparatus of an embodiment of the invention.
Figure 2:
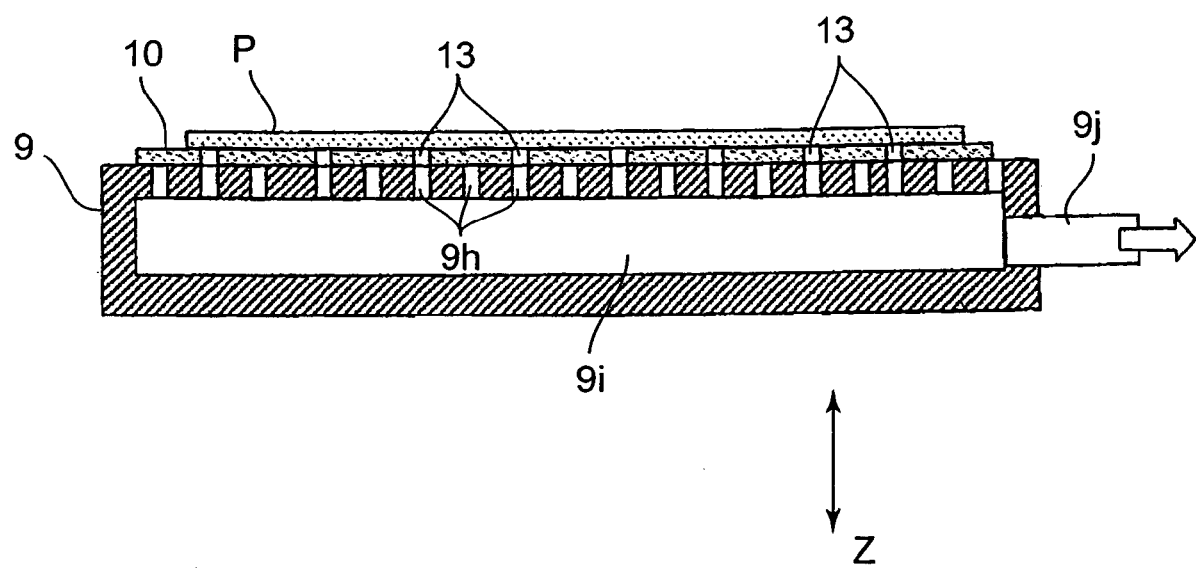
FIG. 2 is a section view of a table of the laser machining apparatus shown in FIG. 1.
Figure 3:
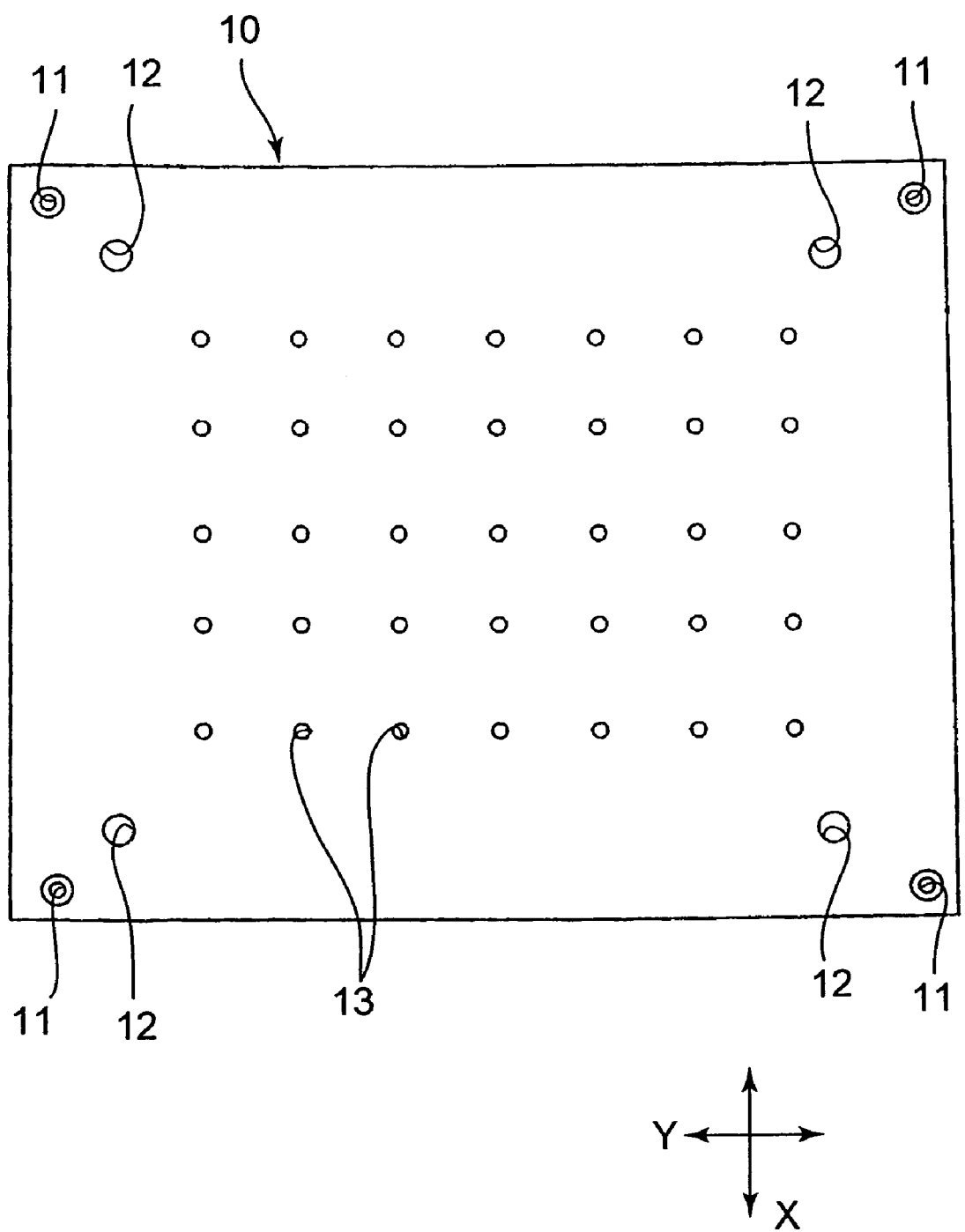
FIG. 3 is a plan view of a jig plate of the invention.

FIG. 1 is a front view of a laser machining apparatus as a workpiece machining apparatus of an embodiment of the invention, FIG. 2 is a section view of a table of the laser machining apparatus shown in FIG. 1 and FIG. 3 is a plan view of a jig plate of the invention.

The laser machining apparatus for machining workpieces by laser is shown in the embodiment. However, because the invention relates to the workpiece machining apparatus arranged so as to be able to accurately machine the workpieces by accurately detecting position of the workpieces, the invention includes not only the light receiving space but also machining apparatuses that machine workpieces by tools such as a drill and end mill. Still more, although a printed circuit board is referred to as a workpiece in the embodiment, the workpiece is not limited to be a printed circuit board.

An overall structure of the laser machining apparatus will be explained first.

In FIG. 1, an X-table 2 of the laser machining apparatus 100 is supported by guides 2G and is arranged so as to move on a base 1 in a direction perpendicular to a surface of the sheet (in a direction obverse and reverse of the sheet or in a direction of an arrow X in FIG. 3). A Y-table 8 is supported by guides 8G and is arranged so as to move on the X-table 2 in a direction of an arrow Y. A table 9 is fixed on the Y-table 8. A jig plate (intermediate member) 10 is fixed on the table 9 by means of bolts not shown. A printed circuit board P is placed on the jig plate 10 and is chucked by air as described later.

Mirrors 5, a pair of optical mirrors 4 and an Fθ lens 3 are disposed on an optical path of a beam 6a outputted out of a laser oscillator 6. The optical mirrors 4 and the Fθ lens 3 are disposed on a head 40 movable in a vertical direction (in a direction of an arrow Z. A camera 20 and illuminants 22 are disposed on a side of the head 40. A center axis of an X-table 21 of the camera 20 is in parallel with a center axis of the Fθ lens 3. The illuminants 22 are disposed so as to surround the camera 20.

The table 9 will be explained below.

As shown in FIG. 2, a space 9i formed within the table 9 is connected to a vacuum pump not shown through a joint 9j. A plurality of vacuum chuck holes 9h communicating with the internal space 9i is formed on the surface of the table 9. Thus, the table 9 has an excellent workpiece holding performance, contributing to reduction of a running cost.

Next, the jig plate 10 will be explained.

As shown in FIG. 3, the jig plate 10 has mount holes 11, the same number of light-receiving holes 12 with alignment holes formed through the printed circuit board P and the vacuum chuck holes 13 formed therethrough. Bolts not shown for fixing the jig plate 10 to the table 9 penetrate through the mount holes 11. The chuck holes 13 are disposed so that their centers coincide with the other chuck holes 9h among the chuck holes 9h formed through the table 9 as shown in FIG. 2. Thus, the jig plate 10 also has an excellent workpiece holding performance, contributing to the reduction of the running cost.

The four light-receiving holes 12 are formed at positions where their centers coincide with the alignment marks (through-holes) 18. A diameter d2 of the light-receiving hole 12 is formed so as to meet the following equation 1, where a diameter of the alignment mark (through-hole) 18 is d1 and positioning precision in setting the printed circuit board P on the jig plate 10 is A (normally about 1 mm). A plate having a thickness of T that meets the following equation 2 is used as the jig plate 10.

$$d2 > (1.2 d1 + A) \quad \text{Eq. 1}$$

$$T > 1.5 d2 \quad \text{Eq. 2}$$

The following equation 3 may be found from the equations 1 and 2:

$$(T/1.5) > d2 > (1.2 d1 + A) \quad \text{Eq. 3}$$

Accordingly, preferably, the diameter d2 of the light-receiving hole 12 is set as follows:

$$T > d2 > d1 \quad \text{Eq. 4}$$

Figure 4:
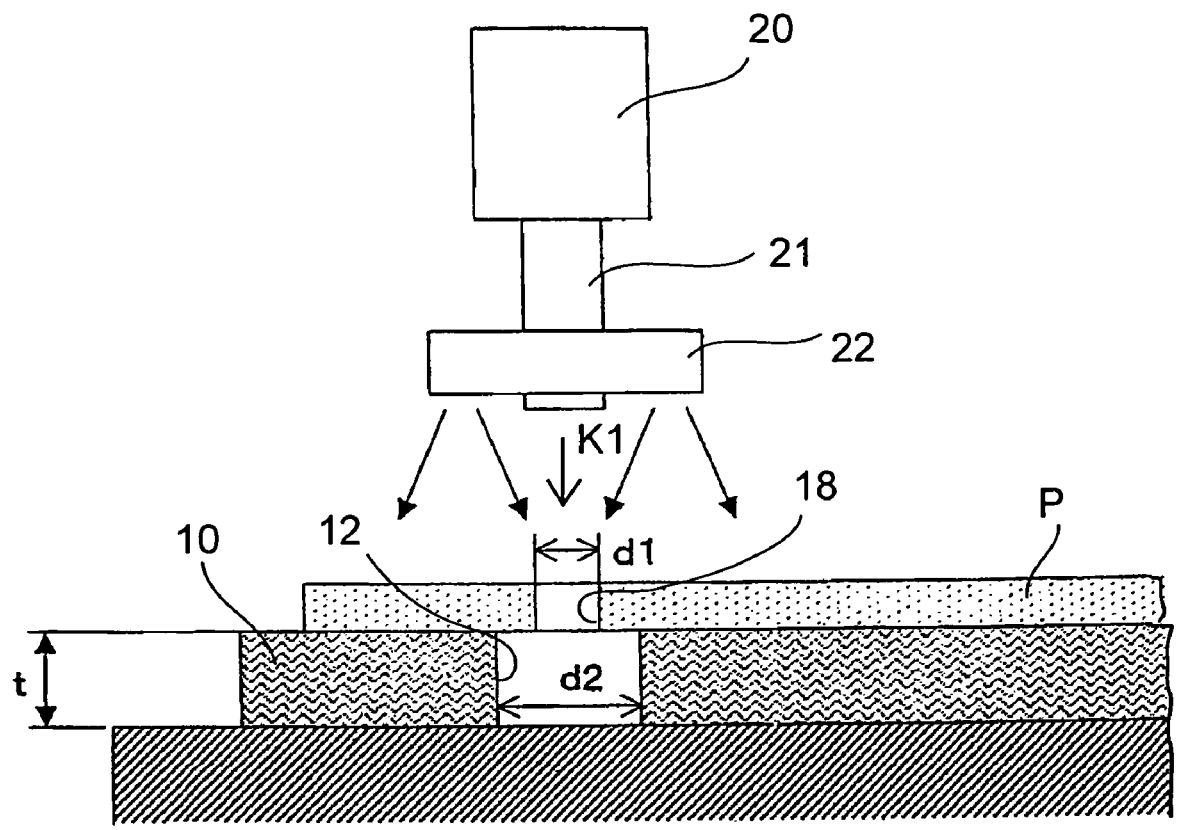
FIG. 4 is a section view of a light-receiving hole and an alignment mark.
Figure 5:
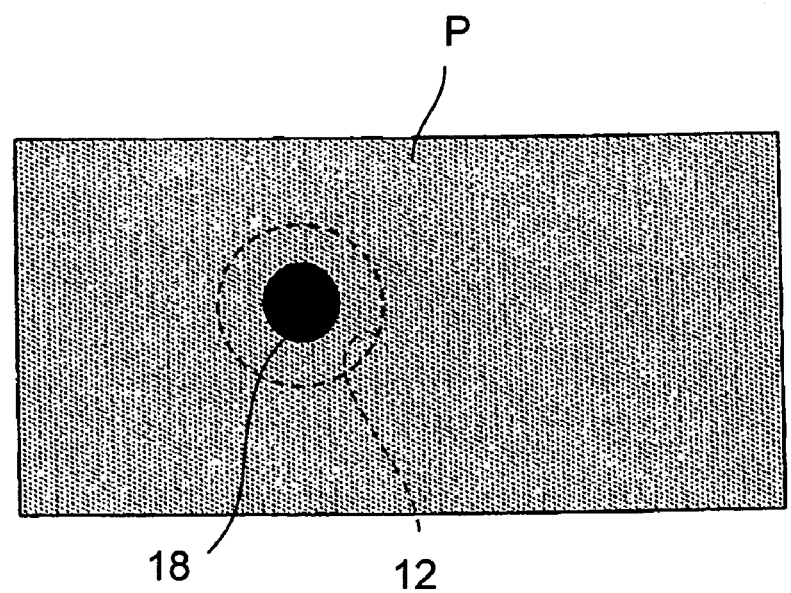
FIG. 5 shows a printed circuit board P seen in a direction of an arrow K1 in FIG. 4.
Figure 6:
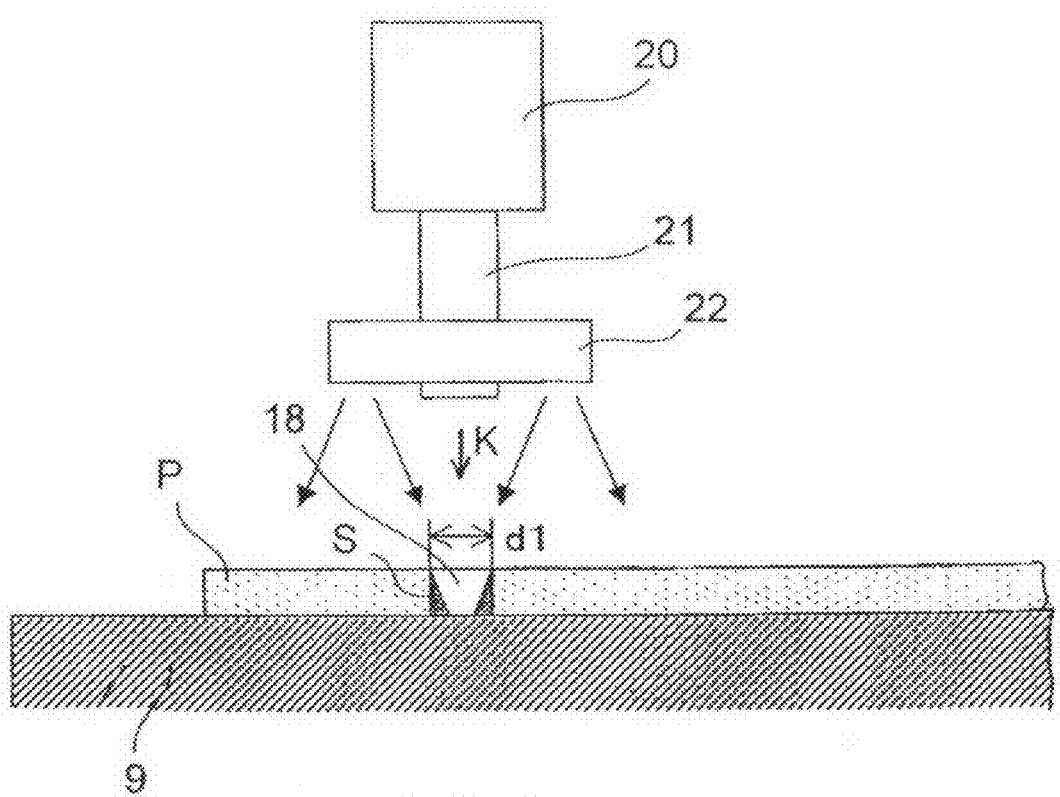
FIG. 6 shows a prior art method for scanning an image of an alignment mark.
Figure 7:
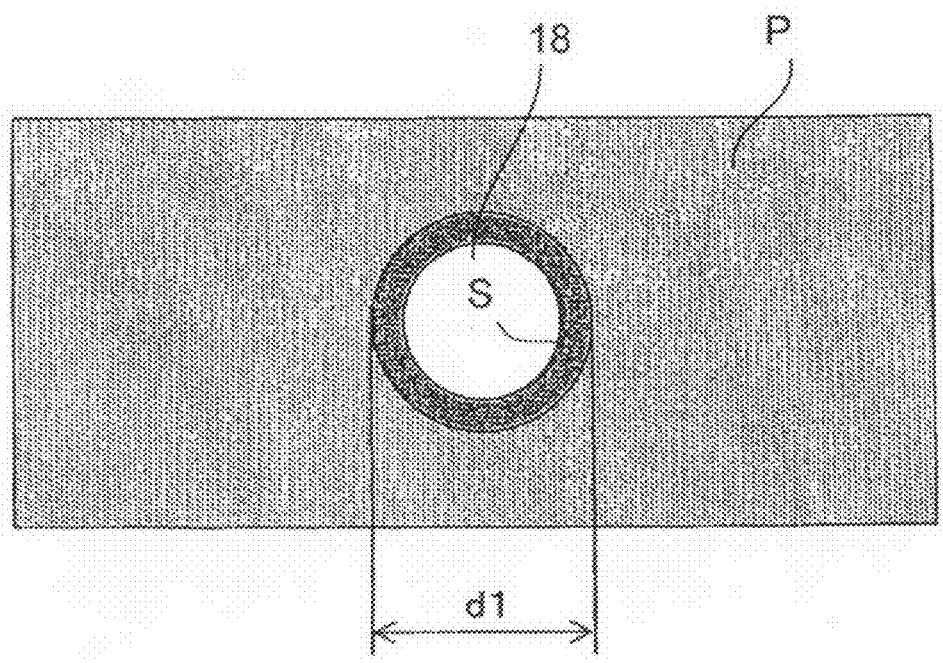
FIG. 7 shows a printed circuit board P seen in a direction of an arrow K in FIG. 6.

Next, an operation for detecting the alignment mark 18 will be explained. FIG. 4 is a section view of the light-receiving hole 12 and the alignment mark (through-hole) 18 and FIG. 5 shows the printed circuit board P seen in a direction of an arrow K1 in FIG. 4.

When light sources (illuminants) 22 are lit after positioning a center axis of the alignment mark 18 with the designed center of the alignment mark 18, part of light illuminated from the light sources 22 enter within the light-receiving hole 12. The light entering to the inside of the light-receiving hole 12 illuminates the alignment mark 18 from underneath thereof by being reflected by the surface of the table 9. As a result, no shadow of the alignment mark 18 occurs, and the profile of the alignment mark 18 becomes clear as shown in FIG. 5.

An image processing device not shown binarizes image data around the alignment mark 18 scanned by the camera 20 (the alignment mark 18 is discriminated as black and the surface of the printed circuit board P is discriminated as white in case of the figure) to detect the profile of the alignment mark 18 and calculates center coordinates of the alignment mark 18 directly from the round profile or from the center thereof.

It is noted that laser machining carried out after determining the center coordinates of the alignment mark 18 is the same with the prior art technique, so that its explanation will be omitted here.

The invention improves the detecting precision because it allows a width of threshold values in binarizing the image data to be increased (i.e., roughed) as compared to the prior art and discriminate the scratches on the surface of the printed circuit board P around the alignment mark 18 as white.

Still more, it becomes possible to detect the center coordinates of the alignment mark 18 accurately, and to improve the machining precision because the laser machining apparatus can detect the profile of the alignment mark 18 accurately.

Furthermore, according to the present embodiment of the invention, the printed circuit board P is steadily chucked because the chuck holes 13 that communicate with the chuck holes 9h formed through the table 9 are provided on the jig plate 10

It is noted that the thickness T of the jig plate 10 is arranged to be 1.5 times or more of the diameter d2 of the light-receiving hole 12 to make the contrast more clear, it may be around one time.

Still more, the material of the jig plate 10 may be metal or synthetic resin, as long as it readily reflects light.

What is claimed is:

1. A workpiece machining apparatus, comprising:
   a movable table for supporting a workpiece to be machined;
   a position detecting device for detecting a position of the workpiece by reflected light from a position-detecting through hole formed through the workpiece, the position detecting device including a camera surrounded by illuminants for illuminating the position-detecting through hole of the workpiece, the camera facing an upper surface of the workpiece to be machined; and
   a plate-like intermediate member provided between an upper surface of the movable table and a lower surface of the workpiece, the intermediate member having a light-receiving opening overlapping with the position-detecting through hole of the workpiece and whose opening area is wider than an opening area of the position-detecting through hole.

2. The workpiece machining apparatus according to claim 1, wherein a horizontal cross section of the light receiving opening of the intermediate member is circular.

3. The workpiece machining apparatus according to claim 1, wherein the light-receiving opening of the intermediate member has a diameter larger than a diameter of the position-detecting through hole of the workpiece.

4. The workpiece machining apparatus according to claim 3, wherein a thickness of the intermediate member is larger than the diameter of the light-receiving opening of the intermediate member.

5. The workpiece machining apparatus according to claim 2, wherein the light-receiving opening of the intermediate member has a diameter larger than a diameter of the position-detecting through hole of the workpiece.

6. The workpiece machining apparatus according to claim 1, wherein the movable table has vacuum chuck holes, and the intermediate member has vacuum chuck holes aligned with the vacuum chuck holes of the movable table so as to allow a vacuum to be applied to the workpiece to thereby retain the workpiece against the intermediate member.

7. The workpiece machining apparatus according to claim 1, further comprising a laser oscillator and mirrors for directing a laser beam generated by the laser oscillator toward the workpiece.

* * * * *